United States Patent [19]
Simonelic

[11] 3,829,962

[45] Aug. 20, 1974

[54] ACTIVE TRIMMING OF FILM DEPOSITED OSCILLATORS

[75] Inventor: Joseph J. Simonelic, Hinsdale, Ill.

[73] Assignee: GTE Automatic Electric Laboratories Incorporated, Northlake, Ill.

[22] Filed: Dec. 4, 1972

[21] Appl. No.: 312,016

[52] U.S. Cl. .................. 29/593, 29/610, 51/165.74, 264/62, 264/104, 324/79 R, 331/44

[51] Int. Cl. .................. G01r 29/02

[58] Field of Search ............ 29/593, 574, 583, 610, 29/620; 331/44, 64; 338/195; 51/165.74; 324/62, 79, 181, 186; 264/61, 62, 104, 272

[56] References Cited

UNITED STATES PATENTS

| | | | |
|---|---|---|---|
| 3,234,484 | 2/1966 | Cooper | 331/64 X |
| 3,409,841 | 11/1968 | Munn | 331/44 |
| 3,704,414 | 11/1972 | Herbst | 324/79 D |
| 3,745,475 | 7/1973 | Turner | 324/79 D |

OTHER PUBLICATIONS

Brackney & Gosch, "Pulse Comparator Circuit Measures Frequency Jitter," Electronics, July 7, 1961, pp. 54–56.

*Primary Examiner*—Charles W. Lanham
*Assistant Examiner*—Joseph A. Walkowski

[57] ABSTRACT

A system for calibrating oscillators by trimming film resistors includes a network for energizing a film oscillator under simulated operating conditions, with a digital counter measuring the frequency of the active oscillator by counting with a zero axis register the number of times the oscillator signal waveform crosses the zero axis of a zero axis detector and thereafter converting to frequency by dividing the resulting count by the count of a simultaneously triggered time register, comparing this measured frequency to a predetermined frequency to be achieved, and physically modifying the film resistor in response to the frequency comparison to correct the frequency of the film oscillator.

4 Claims, 1 Drawing Figure

PATENTED AUG 20 1974
3,829,962
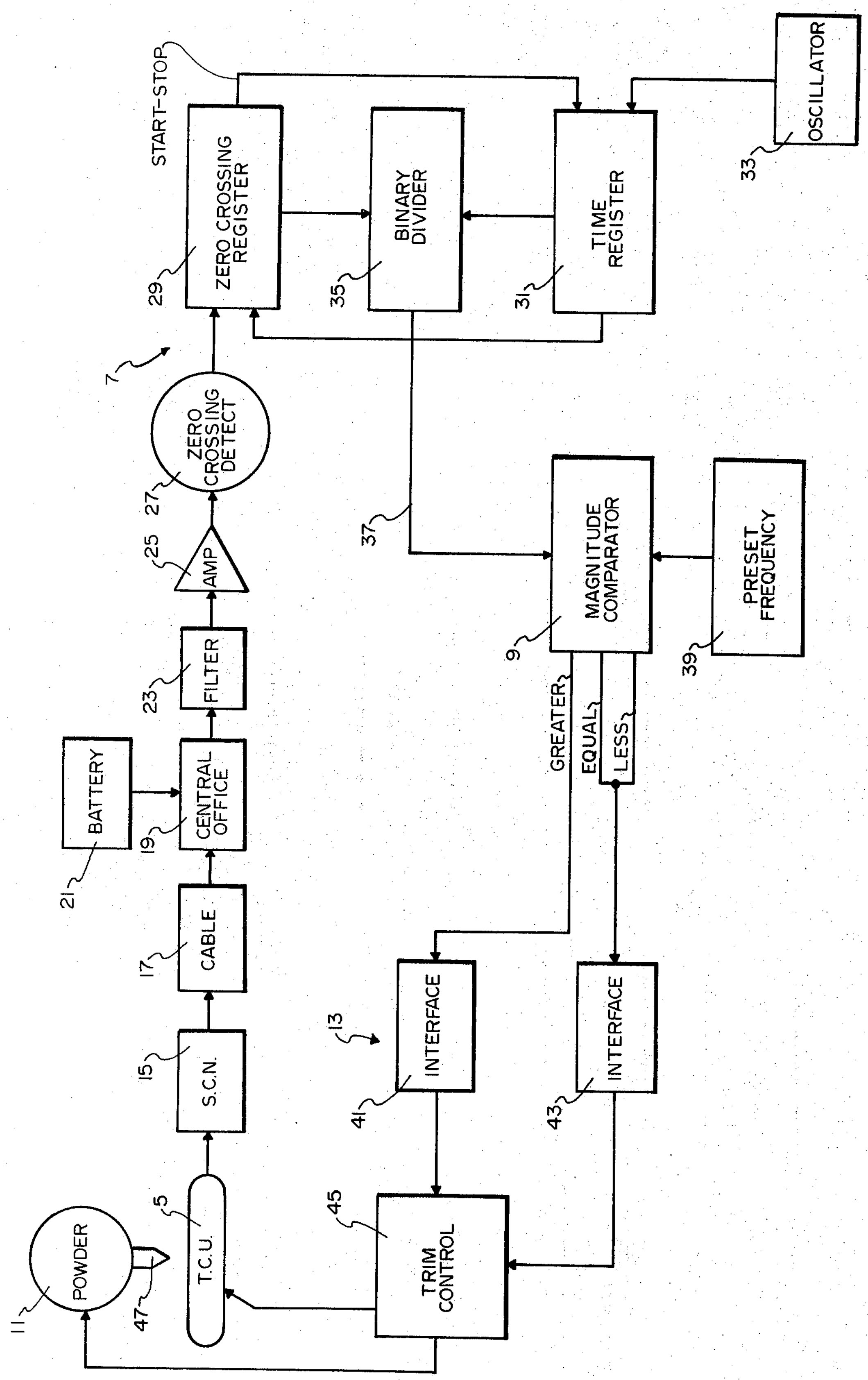

ACTIVE TRIMMING OF FILM DEPOSITED OSCILLATORS

The present invention relates to calibrating oscillators by trimming film resistors, and more particularly it relates to active frequency trimming of film resistors.

Many electronic circuits employ resistor-capacitor oscillator networks formed on a substrate using thick film hybrid circuit techniques. Where the frequency of the oscillator is critical, the oscillator is finely tuned or trimmed to a desired frequency within permitted tolerance, the precision of the tuning depending upon the circuit in which it is to be employed. In instances where the tuning is a part of a production or assembly line operation, the system employed in accomplishing such tuning is economically important.

An example of such an oscillator circuit that requires precision adjustment is that used to provide tone dialing in telephone handsets. The proper functioning of push-button or Touch Calling tone generators in telephones depends on accurate adjustments of a plurality of discrete frequencies in each generator. For production purposes, it is desirable that these adjustments be accomplished automatically and quickly as well as precisely.

It has been heretofore proposed that a resistor-capacitor oscillator be adjusted by measuring the frequency of oscillation and the resistor values, then computing new values for the resistors that are required to sustain oscillation at a particular desired frequency. During this type of frequency adjustment, the resistor values are monitored continuously, typically by computer equipment. The resistor values are altered in various ways, such as by the controlled application of powders to abrade the resistor film or by the application of laser beams, both of which increase the resistance value by removing portions of the resistive film. After the resistors are trimmed to their new computed values, it is usually necessary to provide a frequency verification measurement.

Measuring of resistance value in other types of film resistor trimming systems is generally accomplished directly by the use of a Wheatstone bridge arrangement to trim component resistors to a pre-set resistance value. Alternatively, such a system could take the form of actively trimming to a voltage measurement, but in essence it is the same system wherein the preset resistance control has been essentially relabeled in terms of voltage. Further, an on-line computer could be provided to remember and then compute new values of each of the discrete frequencies. Such, of course, would require a computer program which would include complex equations. Where other applications each present a different class of oscillator, a different set of complex equations and a new program would be developed. While such trimming may be done with precision, the frequency of the oscillator once it has been applied in its working environment may still be uncertain because the frequency may be changed by the presence of other circuit elements in the environment.

It is an object of the present invention to provide an improved automatic frequency trimming control system for oscillators.

It is another object of the present invention to provide an improved frequency trimming system of the aforementioned type that accomplishes accurate resistor trimming in an extremely short period of time, and which is well suited for mass production of hybrid thick film oscillators.

These and other objects of the present invention are more particularly set forth in the following detailed description and in the accompanying drawing.

The accompanying drawing is a single functional block diagram of a preferred embodiment of an operational system of frequency tuning an active oscillator by digital frequency measurement and comparison.

The present system includes a network for energizing a film oscillator under simultaed operating conditions. For purposes of illustration, the system is described in connection with a resistor-capacitor oscillator of the type conventionally used with a touch calling tone generator. While such an oscillator is thus described, it is, of course, not intended to limit the present invention to a system for and a method of trimming only the particular oscillator described. It should be understood that the present system can be used to make frequency adjustments on all types of data set oscillators as well as other commonly used oscillators requiring less precision.

Briefly, the method of the invention utilizes the illustrated system to measure the frequency output of a touch calling unit 5 (TCU) with a digital counting system 7, comparing the measured frequency to a pre-set frequency in a magnitude comparator 9, and controlling an abrader 11 by an interface system 13 to trim a film resistor and the TCU 5 in response to the output of the magnitude comparator 9. As will be seen in detail hereinafter, these steps afford active trimming of a film resistor while the oscillator of which it is a part is functioning in a simulated environment electrically equivalent to its field environment, and in the active trimming of the oscillator frequency to adjust the frequency with controlled precision to that desired in a short period of time.

More specifically, the touch calling tone generator typically has a plurality of discrete frequencies that require initial adjustment. The system disclosed is duplicated for each discrete frequency. For purposes of illustration, however, it is sufficient to describe the operation of only one such system for one resistor-capacitor oscillator.

Assume that the generator in the illustrated TCU 5 requires very accurate tuning to provide the appropriate frequency. Assume further that this accuracy is in the order of ±0.05 percent, or ±500 parts per million. Therefore, if a tone has a frequency of 710 hertz, the permissible error is approximately ±0.35 hertz. The following describes a workable production system to automatically, quickly, and precisely tune an oscillator to such a frequency.

As previously indicated, the TCU 5 may be a conventional touch tone unit or module known in the art which includes a thick film hybrid oscillator circuit disposed on a substrate and having at least one film deposited resistor thereon (not shown). A conventional fixture (not shown) is provided to hold the TCU 5 module for adjusting and testing. The connecting leads to the module are carefully placed in a well known manner to prevent excessive capacitance and to equalize the capacitances to the leads. The placement of the TCU 5 module in the fixture connects the module to a simulated self-compensating network 15 (SCN). At this point a simulated telephone cable 17 is introduced into the circuit which leads to a simulated telephone central office 19 to which DC power in the form of a battery 21 is connected.

The output signal of the TCU 5 under test is taken from the simulated central office 19 and passed through a band pass filter 23 and an amplifier 25.

The units thus far described provide for operating the TCU 5 module under simulated telephone loop conditions, with the same impedances, loading and voltage that would be applied in an actual field installation. The circuits of the self-compensating network 15, the telephone cable 17, the central office 19, and the battery can be of any conventional, well known type, and there is no need herein to set them forth in detail. The characteristics of these circuits are predetermined for any given installation, since they can have an affect on the frequency of the tone of the TCU 5 modules under test. For this reason, it is, of course, preferable that the battery source 21 be well filtered and regulated in a conventional manner.

The filter 23 is provided to remove noise and to narrow the band width of the tone generated from the oscillator in the TCU 5 module under test. To increase the signal-to-noise ratio the filtered signal is then fed through the amplifier 25 before it reaches a zero crossing detector 27. This zero crossing detector applies a signal to a zero crossing register 29 that counts the number of times the signal crosses the zero axis in a given direction, such as the positive direction. This output or count is converted to an output that represents positive zero crossings per unit of time by being fed through a time register 31. A master oscillator 33 provides a reference time to the time register 31. Preferably, the master oscillator 33 is a crystal controlled oscillator with a frequency of ten megahertz which provides a clock pulse each $10^{-7}$ seconds. The two registers 29 and 31 may be conventional binary registers of any suitable type.

The digital counting system 7 used in the illustrated system measures the interval that occurs between successive positive zero crossings of the measured signal. Thus, the signal synchronously opens the time register 31 at a positive zero crossing and then the register accumulates counts or clock pulses from the master oscillator 33 until the next positive zero crossing of the signal. In other words, it accumulates for one complete cycle. Since the clock pulses from the master oscillator 33 are related directly to time, the accumulation of pulses during one cycle effectively measures the length of time for that cycle, the reciprocal of which provides the frequency of the signal.

Inherently such circuits as are here being utilized produce noise, and noise may produce error in the zero detection and cause system uncertainty. Because of this noise and uncertainty in zero crossing detection, it is a feature of the present system that a plurality of complete cycles are measured during a nominal rate of time, for example, ten milliseconds, and an average of these cycles is taken to reflect the true frequency measurement. It has been found for the present application that eight complete cycles is a preferred minimum number to average for this purpose. Thus, the zero crossing register 29 provides a total count of eight positive crossings and the time register 31 accumulates the number of clock pulses that occur between the first positive zero crossing and the eighth positive zero crossing. These two binary outputs are fed to a binary divider 35 where the number of crossings are divided by the time so as to produce a binary coded decimal output on line 37 which is directly related to the measured frequency. The binary divider circuit may be of any conventional type well known in the art.

The measured frequency on line 37 is thus the result of the average taken over the eight complete cycles, and after a given frequency measurement it is applied to the magnitude comparator 9. Then, the registers 29 and 31 are reset and readied for the next measurement during the cycle next succeeding the eighth positive zero axis crossing. This results in approximately 78 frequency measurements performed per second.

Each frequency measurement on line 37 is compared to a preset frequency count of a reference generator 39, which is fed into a second input of the magnitude comparator 9, preferably also in binary coded decimal form. The magnitude comparator 9 determines whether a given number is equal to, less than, or greater than another number. This digital comparator circuit may be of conventional design. One such circuit, for example, is obtainable from Sylvania Products Inc. and is known as their I.C. No. SMX300.

The output of the magnitude comparator 9 feeds into the interface system 13. If the true or measured frequency is greater than the preset frequency of reference 39, the output of the magnitude comparator 9 will activate an interface circuit 41. If, on the other hand, the true frequency is equal to or less than the preset frequency of reference 39, the output of the magnitude comparator 9 activates an interface circuit 43. Preferably the preset frequency reference 39 has a manual control for adjusting its output to a desired standard, i.e., the frequency that will produce the particular tone required of the oscillator under test.

Both interface circuits 41 and 43 are connected to a trim control 45. The trim control 45 may be composed of conventional pneumatic control devices for operating the abrader 11. Thus, if the interface circuit 41 is activated, appropriate pneumatic relays are operated to open an airstream to the abrader 11, which in turn conveys abrasive particles from a discharge nozzle 47 onto the film resistor to the TCU 5 module being tested. Since the monitoring of the oscillator frequency is continuous, the abrasion will continue as long as the measured frequency at each frequency measurement remains greater than the preset frequency 39. The actual value of the film resistor is raised as the airstream containing abrasive particles removes material from the film resistor. As the resistor value increases, the frequency at subsequent measurements decreases. At such time as the measured frequency on line 37 decreases to equal or less than the preset frequency of reference 39, the interface circuit 43 is activated to operate other pneumatic controls of the trim control 45 and quickly cause the airstream to the abrader 11 to shut off. If a frequency measurement of a module under test indicates that the frequency is out of tolerance compared to the preset frequency, the module is rejected. Thus, trimming occurs if the true or measured frequency is greater than the preset frequency, and no trimming occurs if the true frequency is less than or equal to the preset value.

Trimming when the true frequency is greater than the preset value is an important feature of the present invention in that it provides a failsafe mode of operation for the system. In the event of gross noise, interference or line transients, additional counts are accumulated in the time register 31. As mentioned previously, the counts are directly related to time. Hence additional counts in the binary divider 35 result in a measured apparent frequency that is less than true. The system will stop abrading the film resistor when the apparent frequency is equal to or less than the preset frequency, but it is possible to restart the trim cycle to complete the trimming. The circuit is failsafe in that once the oscillator is trimmed below tolerance, it becomes a reject part.

Thus, the oscillator of the TCU 5 module under test is actively trimmed in that it is supplied with power and provides a frequency under simulated field conditions during frequency measurement and abrading. The trimming responds to the recurring measurements of frequency without specific ascertainment of the value of the resistor being trimmed. Hence, there is no need for monitoring or calculation of resistance values. Although the trim control 45 has been described as controlling a pneumatic abrader 11, the trim control could be adapted by conventional means to control other types of trimmers, e.g., a laser type. Also, of course, the particular interface circuits 41 and 43 which may be employed will depend on the nature and type of trimming apparatus used, since the interface circuits merely convert the digital output signals from the comparator 9 (which are typically low power level) to the necessary signals for driving the trim control circuits 45 (which typically requires higher power levels). The interface circuits 41 and 43 may be merely electromechanical relays or more complex electronic circuits for accomplishing this purpose, but in any event they involve only routine design. The trim control 45 will generally be associated with the trimming apparatus used, and thus will be a part of the commercially supplied equipment employed in the present system. One such abrader 11 and trim control 45, for example, is model LAT100 Abrasive Trimmer as manufactured by S.S. White Company Industrial Division.

The operation of a complete frequency measurement may best be understood by a specific example. Assume a tone having a frequency of 710 hertz. This tone synchronously opens the time register 31 at the first positive crossing and accumulates counts or clock pulses that are produced each $10^{-7}$ seconds from the master oscillator 33 until the next positive zero crossing of the waveform. Dividing one second by 710, it is seen that one cycle time duration is 0.00140845 seconds. Dividing this figure by the time duration of one clock pulse (0.0000001 seconds), it is seen that there are 14,084 clock pulses counted during one cycle of a frequency of 710 hertz. To obtain frequency, the reciprocal of the time duration of one cycle is taken, i.e., the reciprocal of the accumulated count on the time register 31.

As mentioned previously, inherent noise in the circuitry may introduce error in detecting the zero crossings of the signal waveform. Thus, it is desirable to average several cycles to obtain a true frequency measurement. It has been found that eight complete cycles are suitable for this purpose. Therefore, by recycling at a nominal rate of 10 milliseconds, it is possible to obtain seven complete cycles plus a portion of the eighth cycle of the 710 hertz signal. The seven positive zero crossings of the seven complete cycles plus the positive zero crossing next succeeding the termination of the 10 millisecond time period are accumulated in the zero crossing register 29. It can be seen that 710 cycles per second (hertz) is the same as 7.1 cycles per 0.01 seconds. Thus, the timing register 29 accumulates for the first 10 milliseconds (0.01 seconds) in which the 7.1 cycles occur plus 0.0012676 seconds in which the balance of the eight cycles, or 0.9 cycles, occurs.

Converting to clock pulses and adding the result, it is seen that a total of 112,676 counts are accumulated from the first zero crossing to the eighth zero crossing. In the binary divider 35, the number of crossings (eight) is divided by 0.0112676 (seconds) to yield a frequency of 710.000 hertz. This result is accurate to three decimal places and is obtained in approximately 0.011 seconds. The registers are then reset and readied for the next measurement during the next cycle. Thus, in each 0.0128 of a second period (78 times per second) a frequency measurement is performed resulting in the measured frequency indication on line 37. This frequency indication is compared, as previously indicated, to the preset frequency standard 39, which contains five significant digits.

If a simple counter were used to determine frequency with the accuracy herein specified, i.e. ±0.05 percent, it is estimated that an extended 100 second count duration over which to average the frequency would be required to obtain a true reading. An alternative method would be to utilize a phase comparison technique to reduce the 100 second count time duration. Such phase comparison, however, would require, in the present instance, eight master oscillators, because the eight discrete tones are not harmonically related. The presently described digitally derived time measurement system, by contrast, affords this accuracy while yielding a very fast response time (approximately 0.011 seconds), and such digitally controlled and digitally timed trimming system as herein described has the ability to make the trim-not trim decision in the submicrosecond order of time.

In summary, then, a method and system has been described that provides adjustment of the frequency of an oscillator by active trimming of the same while it is operating in a simulated field circuitry environment. The frequency need only be monitored during trimming, since the monitoring also serves as a check on the oscillator after the final trim has been accomplished. A pair of binary registers along with a master oscillator accumulate counts between zero axis positive crossings of the signal and provide a frequency in a binary coded decimal form that is averaged over a plurality of cycles to obtain a true frequency reading. By applying this frequency reading to a magnitude comparator where a desired standard frequency is compared, a trim decision is automatically and quickly made depending on whether the frequency of oscillation is greater or less than the preset standard value. This preset standard value is adjustable to obtain the desired oscillator frequency. Actual resistor value is raised by removing material from the film resistor if the true frequency is higher than the compared standard.

Further, the present method and system is usable for production purposes because of the quickness with which the trimming is accomplished and the ease with which oscillator modules may be interchanged for testing in simulated field circuitry, thus resulting in a fast and relatively inexpensive production system for accurately trimming thick film resistor oscillators.

Moreover, the present digitally derived time measurement system of measuring zero axis crossings of a signal waveform is applicable to square, pulse, triangular or any other periodic waveform. It is not restricted to a sine wave.

While the invention has been described in connection with a preferred embodiment, many alternatives, modifications, and variations may be apparent to those skilled in the art in view of the foregoing description. Accordingly, it is intended to embrace all such alternatives, modifications, and variations as fall within the spirit and scope of the appended claims.

Various features of the invention are set forth in the following claims.

I claim:

1. A method of actively trimming an oscillator having a film resistor comprising the steps of monitoring the output of the oscillator, cumulatively counting the number of times the signal waveform is detected to cross a zero axis reference in a given direction between a first crossing of said zero axis and a preselected succeeding crossing of said waveform, simultaneously cumulatively counting the number of occurrences of clock timing pulses that occur between said first crossing and said succeeding crossing of said waveform, dividing said number of waveform zero axis crossings by said accumulated count of clock pulses to convert said number of waveform crossings to measured frequency of a digital format, comparing the measured frequency to a preset frequency of a digital format, and either removing a portion of said film resistor in response to said comparing when the measured frequency is in a first predetermined relation to said preset frequency, said removing occurring during said monitoring while oscillation continues, or rejecting said film resistor when the measured frequency is in a second predetermined relation to said preset frequency.

2. The method in accordance with claim 1 wherein a first binary register counts the number of times the waveform of the signal crosses the zero axis, a secondary binary register receives clock pulses from a master oscillator and accumulates the pulses, and said first register starts the second register when said waveform crosses said zero axis in said given direction and stops said second register when at a predetermined succeeding time said waveform crosses said zero axis in said given direction.

3. A system for the active trimming of a film oscillator having a film resistor, comprising zero crossing detector means for detecting when the waveform of the oscillator output crosses the zero axis, first binary register means for cumulatively counting the zero crossings in a given direction between a first crossing of said zero axis and a preselected succeeding crossing of said waveform, second binary register means for simultaneously cumulatively counting the number of occurrences of clock timing pulses that occur to relate said waveform zero crossings to units of time, binary divider means for dividing the number of waveform zero crossings in said given direction by the number of clock pulses to determine the measured frequency of the oscillator signal, reference means for supplying a preset frequency, magnitude comparator means for comparing said measured frequency to said preset frequency, and trimming means for removing a portion of said film resistor in response to said comparing means when said oscillator frequency is in a predetermined relation to said preset frequency.

4. The method in accordance with claim 1 wherein said step of counting the number of zero axis crossings of said waveform occurs between the first crossing of said zero axis and an immediately succeeding crossing of said zero axis for obtaining the measured frequency of said signal waveform in one complete cycle thereof.

* * * * *